US011947212B2

(12) United States Patent
Wu et al.

(10) Patent No.: US 11,947,212 B2
(45) Date of Patent: Apr. 2, 2024

(54) ELECTRONIC DEVICE (71) Applicant: InnoLux Corporation, Miao-Li County (TW)

(72) Inventors: Yuan-Lin Wu, Miao-Li County (TW); Yu-Chia Huang, Miao-Li County (TW); Yu-Ting Huang, Miao-Li County (TW); Kuan-Feng Lee, Miao-Li County (TW); Chia-Hung Hsieh, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 471 days.

(21) Appl. No.: 17/154,995

(22) Filed: Jan. 21, 2021

(65) Prior Publication Data
US 2021/0255506 A1    Aug. 19, 2021

(30) Foreign Application Priority Data

Feb. 17, 2020 (CN) .......................... 202010097547.3

(51) Int. Cl.
| G02F 1/1335 | (2006.01) |
| G02F 1/13 | (2006.01) |
| G02F 1/1333 | (2006.01) |
| G02F 1/13357 | (2006.01) |
| H01L 25/16 | (2023.01) |
| H01L 27/15 | (2006.01) |
| H10K 50/86 | (2023.01) |
| H10K 59/12 | (2023.01) |

(Continued)

(52) U.S. Cl.
CPC ...... *G02F 1/133548* (2021.01); *G02F 1/1323* (2013.01); *G02F 1/133305* (2013.01); *G02F 1/133603* (2013.01); *H01L 25/167* (2013.01); *H01L 27/156* (2013.01); *H10K 50/86* (2023.02); *H10K 59/12* (2023.02); *H10K 77/111* (2023.02); *H10K 2102/311* (2023.02)

(58) Field of Classification Search
CPC ............ G02F 1/133548; G02F 1/1323; G02F 1/133305; G02F 1/133603; H01L 25/167; H01L 27/156; H01L 25/0753; H01L 33/62; H10K 50/86; H10K 59/12; H10K 77/111; H10K 2102/311; H10K 59/50; H10K 59/131; Y02E 10/549; Y02P 70/50; G09F 9/301
See application file for complete search history.

(56) References Cited

U.S. PATENT DOCUMENTS

2014/0362565 A1* 12/2014 Yao .................. F21K 9/235
362/223
2019/0043843 A1* 2/2019 Liu ..................... H01L 25/0753
(Continued)

FOREIGN PATENT DOCUMENTS

| CN | 106816460 A | 6/2017 |
| CN | 206332028 U | 7/2017 |
| CN | 109686859 A | 4/2019 |

*Primary Examiner* — Kevin Quarterman
(74) *Attorney, Agent, or Firm* — Winston Hsu (57) ABSTRACT An electronic device which is capable of being bent in a first direction and includes a plurality of light-emitting units and a plurality of conductive patterns overlapping with at least a portion of the plurality of light-emitting units and extending in a second direction. The first direction and the second direction have an angle θ of not greater than 30 degrees.

10 Claims, 9 Drawing Sheets (51) Int. Cl.
  *H10K 77/10*   (2023.01)
  *H10K 102/00*  (2023.01)

(56) References Cited

U.S. PATENT DOCUMENTS

2019/0326329 A1\* 10/2019 Fan ..................... H01L 27/1214
2019/0394879 A1\* 12/2019 Hsieh ..................... A61N 5/062
2020/0161412 A1\*  5/2020 Lin ....................... H01L 27/156
2020/0211450 A1\*  7/2020 Deng ..................... H01L 33/62

\* cited by examiner

FIG. 13

ELECTRONIC DEVICE

BACKGROUND OF THE DISCLOSURE

1. Field of the Disclosure

The present disclosure relates to an electronic device, and more particularly to an electronic device which is capable of being bent in a first direction.

2. Description of the Prior Art

Generally speaking, in recent years, an electronic device or a deformable electronic device has become one of the focuses of the new generation of the electronic technology. Therefore, the demand for flexible display devices which may be integrated into electronic devices has also increased accordingly. An electronic device herein refers to a device which is capable of deforming, such as curve, bend, fold, stretch, flex, roll or in other ways.

When a flexible printed circuit display in a flexible display device is subjected to any of the above deforming conditions, different deformation stresses occur in different regions of the flexible printed circuit display. Such deformation stress may increase the probability of damage to some components. Deformation stress may increase, for example, the probability of cracking of a conductive pattern trace or breaking of a brittle material layer. Due to higher and higher consumers' requests for flexible electronic devices, it is one of the important issues for the manufacturers to cope with how to develop electronic devices with higher reliability.

SUMMARY OF THE DISCLOSURE

According to some embodiments of the present disclosure, an electronic device which is capable of being bent in a first direction is provided. The electronic device includes a plurality of light-emitting units and a plurality of conductive patterns. The plurality of conductive patterns extend along a second direction and overlap at least a portion of the plurality of light-emitting units. The first direction and the second direction may have an angle θ which is not greater than 30 degrees.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. For purposes of illustrative clarity understood, various drawings of this disclosure show a portion of the electronic device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function.

In the following description and in the claims, the terms "include", "comprise" and "have" are used in an open-ended fashion, and thus should be interpreted to mean "include, but not limited to".

When an element or layer is referred to as being "on" or "connected to" another element or layer, it may be directly on or directly connected to the other element or layer, or intervening elements or layers may be presented. In contrast, when an element is referred to as being "directly on" or "directly connected to" another element or layer, there are no intervening elements or layers presented.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

Figure 1:
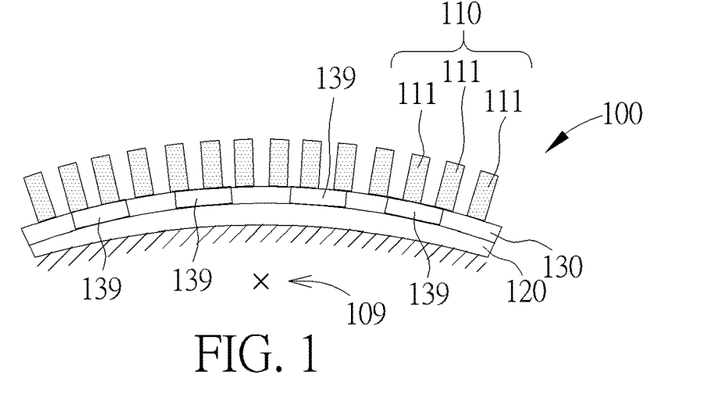
FIG. 1 is a schematic diagram of a cross-sectional view of an electronic device according to the first embodiment of the present disclosure.
Figure 2:
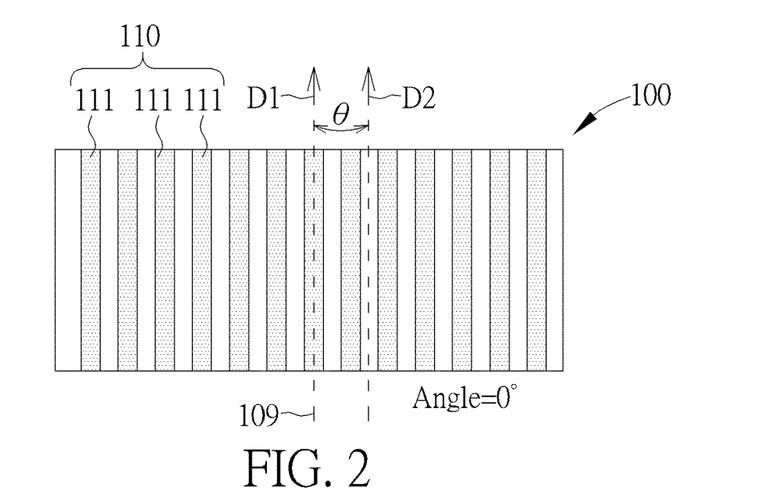
FIG. 2 is a top view which corresponds to FIG. 1.
Figure 3:
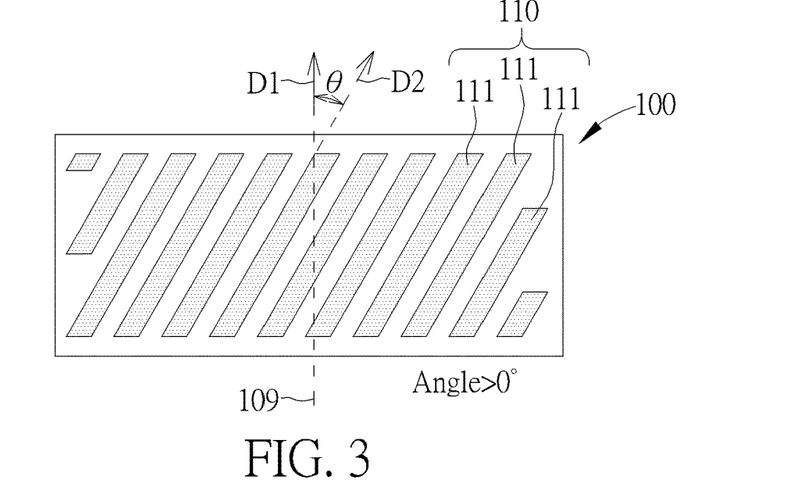
FIG. 3 is a top view which corresponds to FIG. 1.

FIG. 1 is a schematic diagram of a cross-sectional view of an electronic device 100 according to the first embodiment of the present disclosure. FIG. 2 or FIG. 3 is a top view which corresponds to FIG. 1. Please refer to FIG. 1 and FIG. 2. The electronic device 100 may include a flexible substrate 120, a display layer 130 disposed on the flexible substrate 120, and a pattern layer 110 disposed on the display layer 130. The flexible substrate 120 may include a transparent or opaque organic polymer material, for example, may include polyimide (PI), polycarbonate (PC), polyethylene terephthalate (PET), or a combination of the above. In addition, the flexible substrate 120 may also include an adhesive material, but the present disclosure is not limited thereto. The flexible substrate 120 may also include, for example, thin glass, or any suitable material. The display layer 130 may include any type of display medium. For example, the display medium may include liquid crystal, fluorescence, phosphor, a light-emitting diode, other suitable display medium, or a combination of the above, but the present disclosure is not limited thereto. The display layer 130 may include a plurality of light-emitting units 139, and the light-emitting units 139 may include an organic light-emitting diode (OLED), a micro light-emitting diode (micro-LED), a sub-millimeter light-emitting diode (mini-LED), a quantum dot LED (QDLED), a nano wire LED or a bar type LED, but the present disclosure is not limited thereto. The types of the light-emitting diode are not limited, for example, it may include a flip chip type light-emitting diode or a vertical type light-emitting diode, but the present disclosure is not limited thereto.

The electronic device 100 of the present disclosure may include a flexible electronic device, and a bending axis 109 may be used as an axis for bending, as shown in FIG. 1. "Flexible" herein refers to that the electronic device may be curved, bent, folded, rolled, flexible, stretched and/or other similar deformation; "bent" hereinafter is referred to the above-mentioned deformation conditions. The electronic device 100 may include a display device, an antenna device, a sensing device or a tiling device, but the present disclosure is not limited thereto. The antenna device may be, for example, a liquid crystal antenna. The tiling device may be, for example, a display tiling device or an antenna tiling device. It should be noted that the electronic device may include a combination of the above, but the present disclosure is not limited thereto.

Hereinafter, a flexible display device is taken as an example of an electronic device for the descriptions of the present disclosure, that is, the electronic device described as follows may be a display device with flexible functions, but the present disclosure is not limited thereto. As shown in FIG. 1, the electronic device 100 is bent with respect to the bending axis 109 as an axis. As shown in FIG. 2, the electronic device 100 may be capable of being bent in a first direction D1, in other words, the electronic device 100 may be bent along the first direction D1, and the first direction D1 is substantially parallel to the bending axis 109. The pattern layer 110 may include a plurality of conductive patterns 111, and the plurality of conductive patterns 111 may overlap with at least a portion of the plurality of light-emitting units 139. The conductive pattern 111 may be made of a metal selected from gold (Au), silver (Ag), tin (Sn), copper (Cu), aluminum (Al), molybdenum (Mo), titanium (Ti), tantalum (Ta), niobium (Nb), hafnium (Hf), nickel (Ni), chromium (Cr), cobalt (Co), zirconium (Zr), tungsten (W), an alloy of the above-mentioned metals, or a combination of the above, but the present disclosure is not limited thereto. According to some embodiments, the plurality of conductive patterns 111 may be made of a material selected from a group consisting of gold, silver, tin, copper, aluminum, and a combination thereof. The plurality of conductive patterns 111 may be formed by imprinting, deposition, coating or other suitable methods, but the present disclosure is not limited thereto. The at least a portion of the plurality of conductive patterns 111 may be periodically arranged, may be parallel to one another, and may extend along a second direction D2. According to some embodiments, the first direction D1 and the second direction D2 may have an angle of not greater than 30 degrees. In other words, the angle θ between the first direction D1 and the second direction D2 is not greater than 30 degrees, but is not limited thereto. According to some embodiments, please refer to FIG. 2, the first direction D1 and the second direction D2 may be parallel to each other, and the angle θ between the first direction D1 and the second direction D2 may be degree. According to some embodiments, the angle θ between the first direction D1 and the second direction D2 may be greater than 0 degree. That is, as shown in FIG. 3, the first direction D1 and the second direction D2 may not be parallel to each other.

Figure 4:
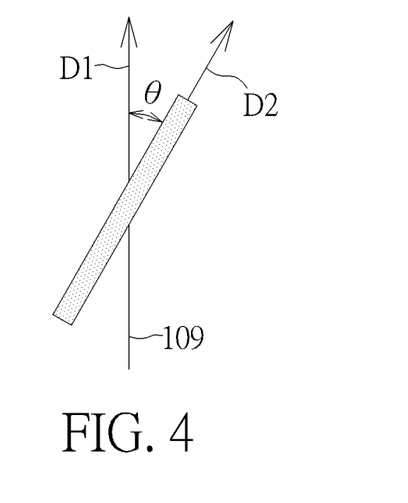
FIG. 4 shows the relationship of the angle θ between the extending direction of the conductive patterns and the first direction when the plurality of conductive patterns and the flexible substrate are subjected to simulated bending.

Next, a finite element model may be used to simulate the relationship between the angle θ and the maximum stress on the flexible display device when the flexible display device is bent. For example, software (MSC.MARC, Node: 713504, Element: 590280) may be used for the simulation. The simulated boundary conditions are: the plurality of conductive patterns 111 may be aluminum metal conductive patterns with a height of 0.634 μm (micrometer), for example the flexible substrate 120 may be a polyimide film with a thickness of 1.5 μm, a radius of curvature of the display device due to the bending is 1 mm, but the present disclosure is not limited thereto. FIG. 4 shows the relationship of the angle θ between the extending direction of the conductive patterns and the first direction when the plurality of conductive patterns and the flexible substrate are subjected to simulated bending. As shown in FIG. 4, the angle θ between the first direction D1 and the second direction D2 is changed, and the maximum stress of the flexible display device is analyzed. The simulation results are shown in FIG. 5 and Table 1.

TABLE 1

| | Angle θ (degree) | | | | | | | |
|---|---|---|---|---|---|---|---|---|
| | 0 | 10 | 20 | 22.5 | 30 | 45 | 60 | 90 |
| maximum stress (MPa) | 23.98 | 25.34 | 29.57 | 32.45 | 39.23 | 55.00 | 70.15 | 83.75 |

Figure 5:
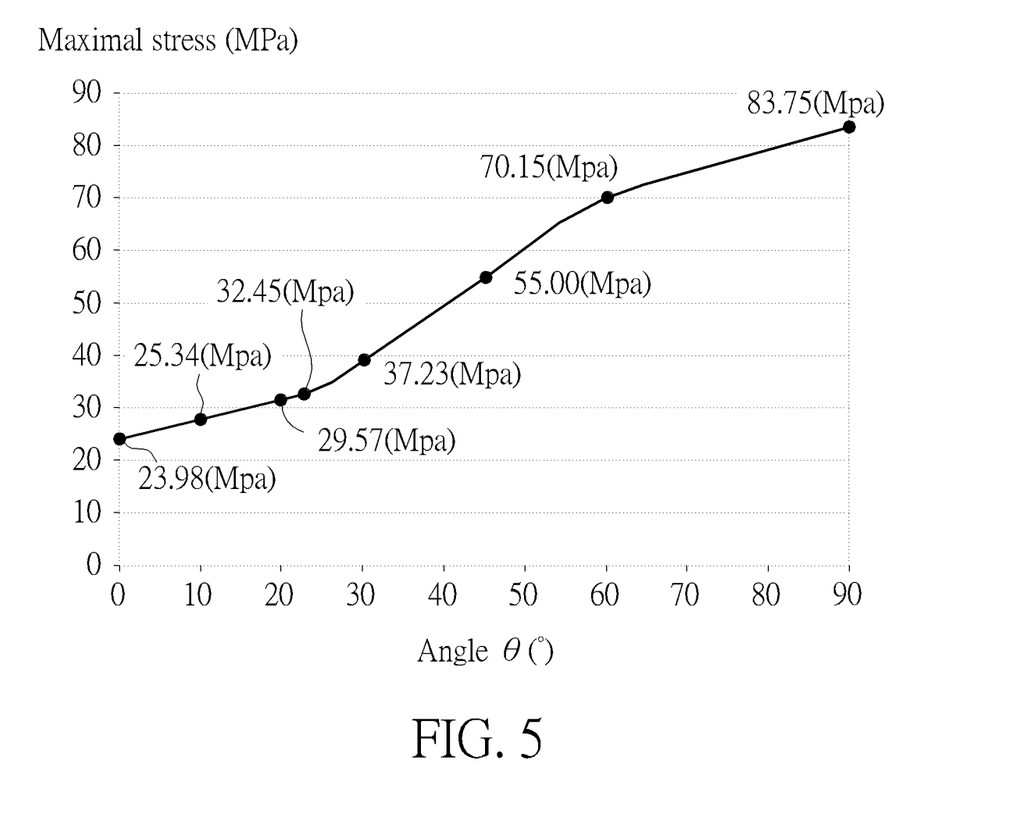
FIG. 5 shows the relationship between the angle θ and the maximum stress subjected to the conductive patterns when the conductive patterns and the flexible display device is subjected to bending in accordance with simulated boundary conditions.

As seen from FIG. 5 and Table 1, the maximum stress of the conductive patterns increases with the increase of the angle θ when the angle θ between the first direction D1 and the second direction D2 is between 0 degree and 22.5 degrees but the increase in the maximum stress is relatively gentle. On the other hand, the maximum stress of the conductive patterns also increases as the angle θ increases when the angle θ is between 30 degrees and 60 degrees but the increase of the maximum stress is drastic.

In the following, a bending test is used to measure the reliability of the flexible display device when the plurality of conductive patterns and the flexible substrate are subjected to a bending radius of 1 mm. The results of the reliability of the flexible display device are analyzed. A microscope is used to examine the flexible display device after being folded 100,000 times under different angles θ. Table 2 shows the measured results of the reliability of the flexible display device.

TABLE 2

| | Angle θ (degree) | | | | | | | | |
|---|---|---|---|---|---|---|---|---|---|
| | 0 | 10 | 20 | 22.5 | 30 | 45 | 60 | 70 | 80 | 90 |
| result | pass | pass | pass | pass | pass | fail | fail | fail | fail | fail |

The test results shown in Table 2 suggest that the conductive patterns may pass the bending test when the angle θ between the first direction D1 and the second direction D2 is not greater than 30 degrees.

According to some embodiments, the angle θ between the first direction D1 and the second direction D2 is designed to be no greater than 30 degrees. According to some embodiments, the angle θ between the first direction D1 and the second direction D2 is designed to be no greater than 22.5 degrees. The designs in accordance with these embodiments suggest that the flexible display device and the plurality of conductive patterns may be subjected to a relatively small bending stress when the flexible display device is bent. Accordingly, it is possible to decrease the possibility of the conductive pattern 111 to be broken or peeled off due to an excessive stress to cause malfunctions of the flexible display device and of the conductive patterns. When the flexible electronic device has a display function, the angle θ design in accordance with some of the above embodiments may also decrease the possibility of malfunctions of display which is caused by a bending stress so that the flexible display device may be likely to function normally when it is subjected to bending.

Figure 6:
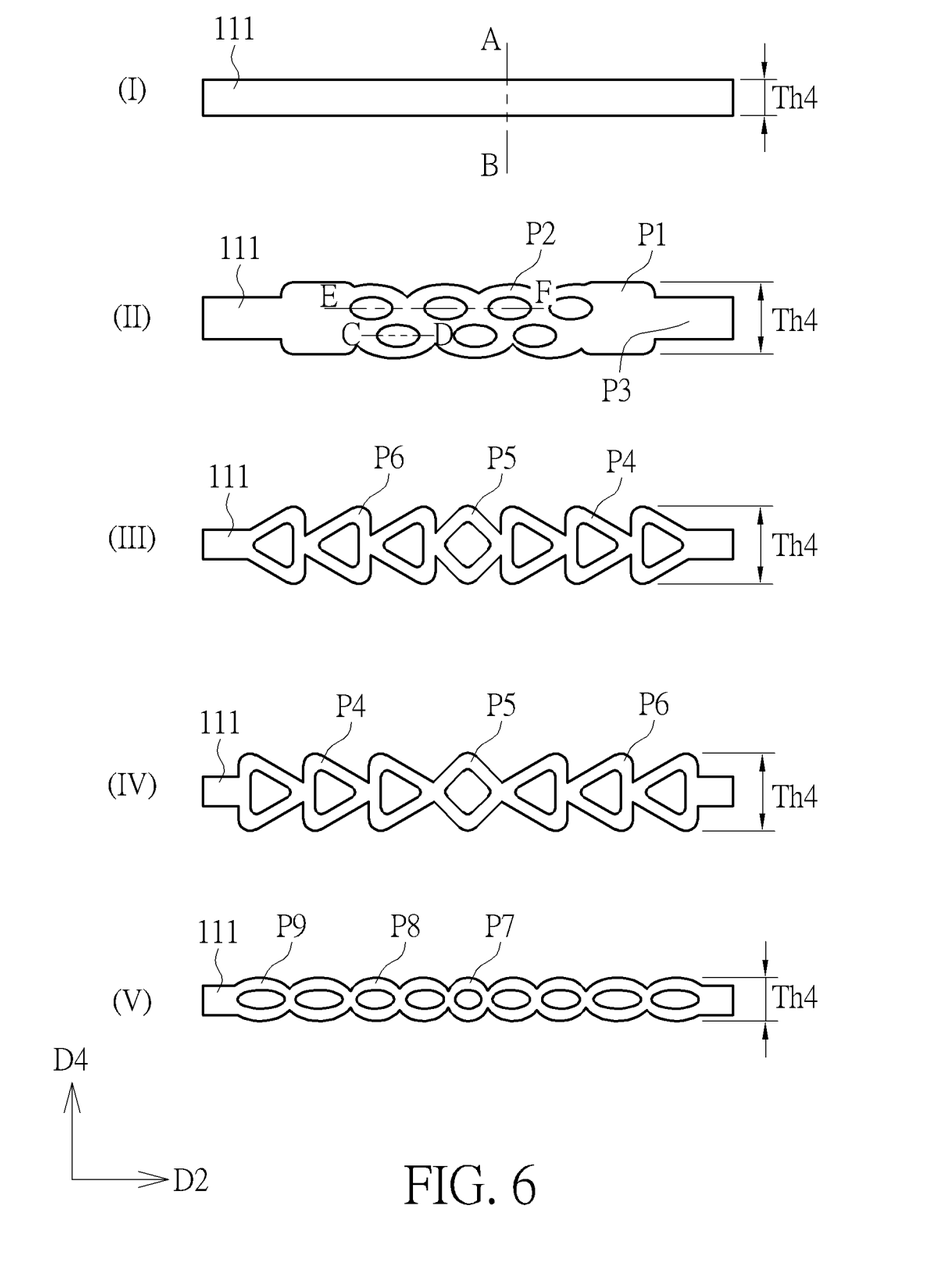
FIG. 6 is a schematic diagram of a partial top view of the conductive pattern of an example in accordance with the second embodiment of the present disclosure.

Please refer to FIG. 6. FIG. 6 is a schematic diagram of a partial top view of the conductive pattern 111 of an example in accordance with the second embodiment of the present disclosure. A metal with good ductility may be used in the plurality of conductive patterns 111 to reduce the probability of breaking of the plurality of conductive patterns 111 when the conductive patterns 111 are subjected to a bending stress.

In the example (I), the conductive pattern 111 may have a linear pattern with two substantially smooth sides. In the example (II), the conductive pattern 111 may be composed of multiple parts, such as a part P1 having a shape similar to a rectangle or a square, a part P2 having a twist shape, and a part P3 having a strip shape or a long rectangle shape. These three parts may intersperse with one another in arrangement, for example, one part P2 may be arranged between two parts P1, and two parts P1 may be arranged between two parts P3. In the example (III), the conductive pattern 111 may be composed of a plurality of parts with different shapes, for example a part P4 and a part P6 have a triangular-like shape, and a part P5 similar to a rhombus or oblique rectangular shape, wherein the part P5 may be located between the part P4 and the part P6, for instance, the tips of the part P4 may be rightward and located on the right side of the part P5, and the tips of the part P6 may be leftward and located on the left side of the part P5. In the example (IV), the tips of the part P4 may be rightward and located on the left side of the part P5, the tips of the part P6 may be leftward and located on the right side of the part P5, and the part P5 may be located between the part P4 and the part P6. In the example (V), the conductive pattern 111 may be composed of a plurality of parts with different shapes, such as a part P7 having a circular pattern, a part P8 having an oval shape, and a part P9 having an oblong shape, wherein the part P7 may be located between two or more adjacent parts P8, and the part P8 may be located between two or more adjacent parts P9. The conductive patterns 111 of the present disclosure are not limited to these as shown in FIG. 6, and any suitable pattern designs may be applied to the conductive patterns of the present disclosure. The pitch, width and line pitch of the conductive patterns of the present disclosure may be designed according to requirements. For example, in an electronic device, the conductive patterns may have the same pitch, but the line width and/or line pitch may be not exactly the same. In another embodiment, the pitch, line width, and/or line pitch of the conductive patterns may be not exactly the same.

Figure 7A:
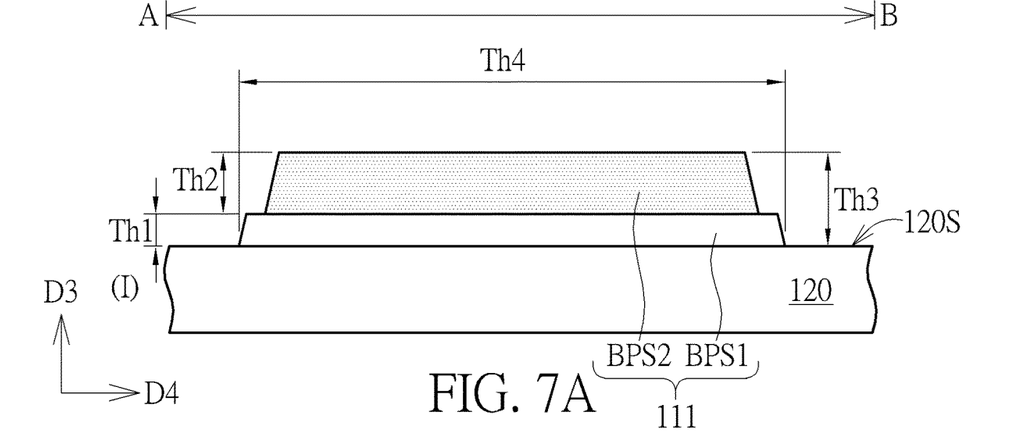
FIG. 7A is a schematic diagram of a partial side view along the line A-B of FIG. 6 of the conductive pattern in Example (I).

Please refer to FIG. 7A. FIG. 7A is another example of the second embodiment of the electronic device of the present disclosure. In Example (I), the cross-sectional shape of the conductive pattern 111 of the double-layer structure is shown. FIG. 7A is a schematic diagram of a partial cross-sectional view taken along the line A-B of FIG. 6. According to some embodiments, the plurality of conductive patterns 111 may be disposed on a surface 120S of the flexible substrate 120. For example, as shown in FIG. 7A, the conductive pattern 111 is disposed on a surface 120S of the flexible substrate 120. Along a third direction D3 perpendicular to the surface 120S of the flexible substrate 120, there may be other layers (although not shown) disposed between the flexible substrate 120 and the conductive pattern 111. These other film layers may include a circuit layer, a light-emitting layer, an encapsulation layer, a function layer, and an insulating layer, etc., but the present disclosure is not limited thereto. A portion of some of these other film layers is shown in the subsequent FIG. 8 and FIG. 11. According to the present disclosure, the conductive pattern 111 may be a composite structure, for example, the conductive pattern 111 may be a double-layer structure or a multilayer structure. The conductive pattern 111 may have a trapezoidal structure with a bottom surface larger than a top surface, but the present disclosure is not limited thereto.

According to some embodiments, as shown in FIG. 7A, at least one of the conductive patterns 111 may include multiple layers. For example, a two-layer structure of the conductive pattern 111 may include a first conductive layer BSP1 and a second conductive layer BSP2, which are sequentially disposed on the surface 120S of the flexible substrate 120, and the second conductive layer BSP2 may be disposed on the first conductive layer BSP1, but the present disclosure is not limited thereto. The first conductive layer BSP1 may have a thickness Th1, and the second conductive layer BSP2 may have a thickness Th2. The thickness Th2 may be different from the thickness Th1. For example, the thickness Th2 may be greater than the thickness Th1, but the present disclosure is not limited thereto. The thickness of the conductive pattern 111 may be the thickness (or height) along the third direction D3, and the third direction D3 may be a direction perpendicular to the surface 120S of the flexible substrate 120. In FIG. 6, a line width of the conductive pattern 111 may be represented by a symbol Th4, which is the width of the conductive pattern 111 along a fourth direction D4, and the fourth direction D4 may be a direction parallel to the surface 120S of the flexible substrate 120. In some embodiments, the ratio of the total thickness Th3 of the conductive pattern to the maximum line width Th4 of the composite structure may be greater than or equal to 0.2 and less than or equal to 15. For example, the first conductive layer BSP1 may include titanium or molybdenum or other materials with better adhesion, and the second conductive layer BSP2 may include aluminum or copper with better ductility, but the present disclosure is not limited thereto. At least one of the conductive patterns 111 may have an appropriate height/width ratio. The conductive pattern 111 may have a total thickness Th3 (or the height of the conductive pattern) along the third direction D3, and may have the line width (or a width) Th4 along the fourth direction D4, and a ratio of the height to the width (height/width ratio) may be greater than or equal to 0.2 and less than or equal to 15. According to some embodiments, the ratio may be greater than or equal to 5 and less than or equal to 15, and according to some embodiments, the ratio may be greater than or equal to 0.2 and less than or equal to 2.

Figure 7B:
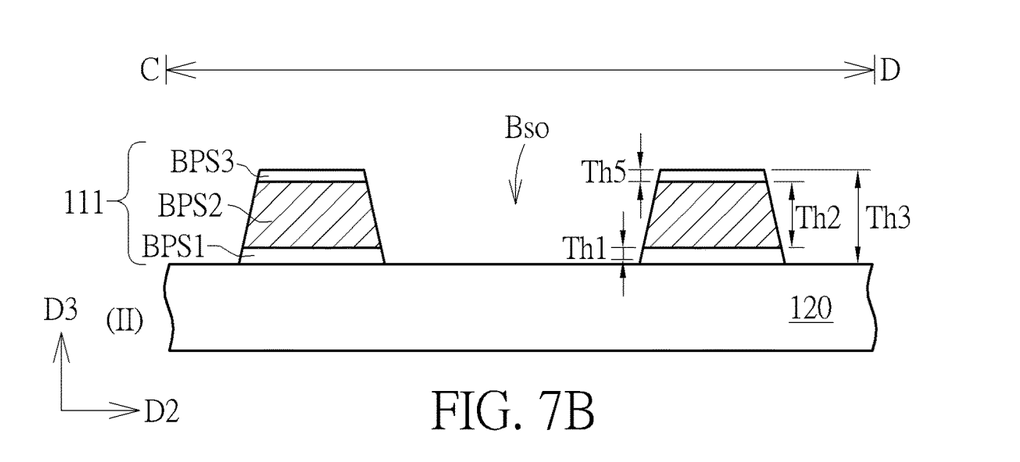
FIG. 7B is a schematic diagram of a partial side view along the line C-D of FIG. 6 of the conductive pattern in Example (II).

Please continue to refer to FIG. 7B. FIG. 7B illustrates a schematic diagram of a partial cross-sectional view of the conductive pattern 111 along the line C-D in FIG. 6 (II) in the example (II). In the example (II), the conductive pattern 111 may include a three-layer structure, for example, a first conductive layer BSP1, a second conductive layer BSP2, and a third conductive layer BSP3 are sequentially disposed on the flexible substrate 120. The first conductive layer BSP1, the second conductive layer BSP2, and the third conductive layer BSP3 may form an opening Bso exposing the substrate 121. At least a portion of the conductive pattern 111 may include a plurality of openings Bso formed thereon. The opening Bso may have a trapezoidal side shape, but the present disclosure is not limited thereto. The thickness Th2 of the second conductive layer BSP2 may be greater than the thickness Th1 of the first conductive layer BSP1, and/or the thickness Th2 of the second conductive layer BSP2 may be greater than the thickness Th5 of the third conductive layer BSP3, but the present disclosure is not limited thereto. At least one of the conductive patterns 111 may have an appropriate height/width ratio. The conductive pattern 111 includes a total thickness/height Th3 in the third direction D3 and a width Th4 (please refer to FIG. 7A), and the ratio of the height to the width may be greater than or equal to 5 and less than or equal to 15. For example, the first conductive layer BSP1 and the third conductive layer BSP3 may include a material with better adhesion such as titanium or molybdenum, and the second conductive layer BSP2 may include a material with better wire ductility such as aluminum or copper, but the present disclosure is not limited thereto.

Figure 7C:
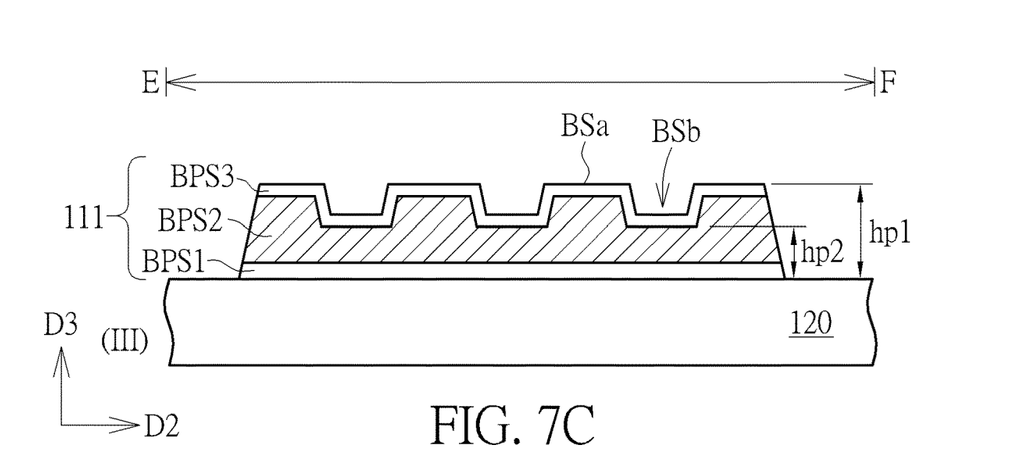
FIG. 7C is a schematic diagram of a partial side view along the line E-F of FIG. 6 of the conductive pattern in Example (III).

FIG. 7C illustrates a schematic diagram of a partial cross-sectional view of the conductive pattern 111 along the line E-F of FIG. 6 (II) in Example (III). The conductive pattern 111 may include a first conductive layer BSP1, a second conductive layer BSP2, and a third conductive layer BSP3 sequentially disposed on the flexible substrate 120. The conductive pattern 111 may include an uneven surface BSa. According to some embodiments, at least a portion of the conductive patterns 111 may include a plurality of recessions BSb formed thereon. For example, the first conductive layer BSP1 and the second conductive layer BSP2 may form the plurality of recessions BSb so the third conductive layer BSP3 on the second conductive layer BSP2 may form an uneven surface BSa. In other words, the three-layer composite structure of the conductive pattern 111 may include at least two thicknesses: the thickness hp1 and thickness hp2, wherein the ratio of the maximum thickness hp1 to the maximum line width Th4 of the conductive pattern 111 (please refer to FIG. 7A) may be greater than or equal to 0.2 and less than or equal to 15, but the present disclosure is not limited thereto. In some embodiments, the conductive pattern may also be a multilayer structure, and the multilayer structure may include at least two or more thicknesses, but the present disclosure is not limited thereto.

The plurality of conductive patterns 111 may have different functions to serve as elements of different functions. According to some embodiments, the plurality of conductive patterns 111 may serve as a polarizer, an electrode layer, an anti-reflection layer, a wire layer, or a combination thereof. For example, the polarizer may include a wire grid polarizer (WGP). For example, the electrode layer may include a privacy electrode layer. For example, the wire layer may include a signal line layer or a power line layer. According to some embodiments, by appropriately designing the angle θ between the first direction D1 and the extending direction of the conductive patterns (the second direction D2), the conductive patterns may be kept from creaking or peeling off due to an excessive stress when the electronic device is subjected to bending. As a result, the functions of the conductive patterns may be intact and the display function of the electronic device may be intact even when the electronic device is in a bent state.

Figure 8:
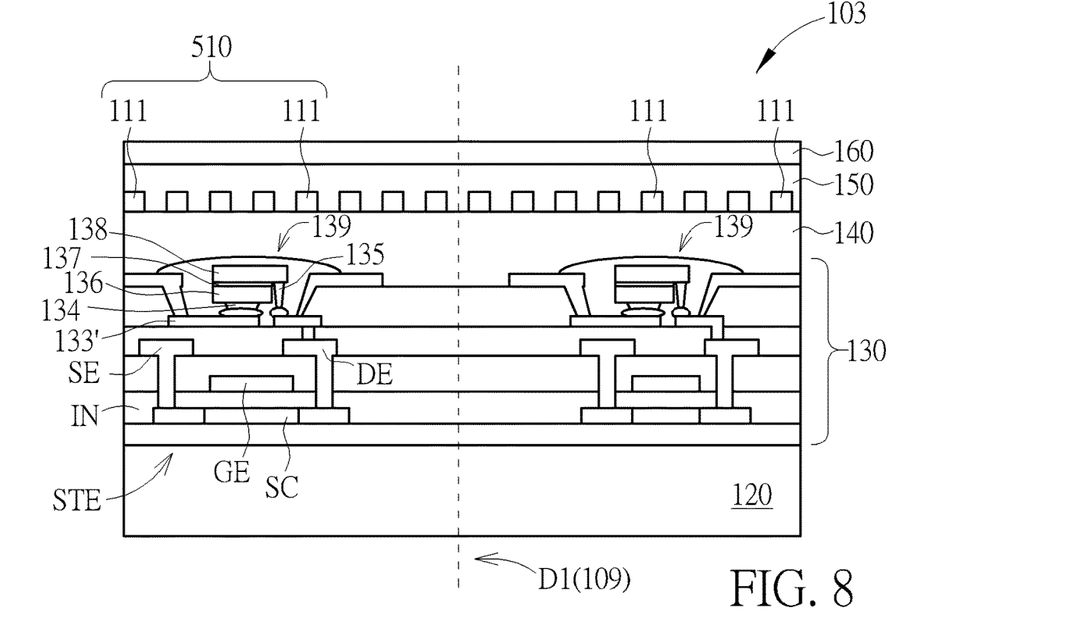
FIG. 8 is a schematic diagram of a partial cross-sectional view of the third embodiment of the electronic device of the present disclosure.

Please refer to FIG. 8. FIG. 8 is a schematic diagram of a partial cross-sectional view of the third embodiment of the electronic device 103 of the present disclosure. For example, the electronic device 103 may include a flexible substrate 120, a display layer 130, an encapsulation layer 140, a plurality of conductive patterns 111, a function layer 150, and a cover layer 160, but the present disclosure is not limited thereto. The display layer 130 may be disposed on the flexible substrate 120, and the display layer 130 may include a plurality of light-emitting units 139, such as a light-emitting diode. The light-emitting diode may include, for example, a flip-chip light-emitting diode. One light-emitting unit 139 may include a first electrode 134, a second electrode 135, a first semiconductor layer 136, a light-emitting layer 137, and a second semiconductor layer 138. The light-emitting layer 137 may be, but not limited to, a multiple quantum well (MQW) layer, for example. The first electrode 134 may be electrically connected to the common electrode through a bonding pad 133'. The driving element STE may be electrically connected to the light-emitting unit 139. In addition, according to some embodiments, the driving element STE may be a thin film transistor, which may include a gate electrode GE, a source electrode SE, a drain electrode DE, and a semiconductor layer SC, wherein the source electrode SE and the drain electrode DE may be respectively electrically connected to the semiconductor layer SC. According to some embodiments, the semiconductor layer SC may overlap the gate electrode GE. The insulating layer IN may be disposed between the gate electrode GE and the semiconductor layer SC. The source electrode SE may be electrically connected to the signal line, for example. The drain electrode DE may be electrically connected to the bonding pad 133' or to a connection layer electrically connected to the corresponding light-emitting unit 139. The semiconductor layer SC may be formed of a semiconductor material, such as silicon or metal oxide, but the present disclosure is not limited thereto. For example, the semiconductor layer SC may be an amorphous silicon layer, a polysilicon layer, or an indium gallium zinc oxide (IGZO) layer. The gate electrode GE, the source electrode SE, and the drain electrode DE may be formed of a conductive material, for example a metal, and may be the same or different materials, but the present disclosure is not limited thereto.

Furthermore, the encapsulation layer 140 may be disposed on the display layer 130. The encapsulation layer 140 may provide the display layer 130 with functions such as protection, encapsulation and/or planarization, but the present disclosure is not limited thereto. The encapsulation layer 140 may be an inorganic layer, an organic layer, or a combination of the above. For example, the encapsulation layer 140 may be a multilayer structure, and may include an inorganic layer, an organic layer, and an inorganic layer.

The plurality of conductive patterns 111 may be disposed on the encapsulation layer 140 and between the encapsulation layer 140 and the function layer 150. The plurality of conductive patterns 111 may serve as a polarizer 510. In some embodiments, the polarizer 510 may be a wire grid polarizer. For example, the plurality of conductive patterns 111 may include a plurality of wire grid polarizer elements to serve as a wire grid polarizer. The plurality of conductive patterns 111 disposed on the plurality of light-emitting units 139 may overlap at least a portion of the plurality of light-emitting units 139 and extend along the second direction D2 as shown in FIG. 3 or in FIG. 2.

The function layer 150 may be disposed on the encapsulation layer 140 to increase the functions of the electronic device 103. For example, the function layer 150 may be a privacy sheet, and the privacy sheet may be partially disposed in the electronic device 103, so that the electronic device 103 may have a display function of a narrow viewing angle, but the present disclosure is not limited thereto. According to some embodiments, the function layer 150 may provide optical functions. Optionally, the cover layer 160 may be provided on the function layer 150. The cover layer 160 may be a transparent capping layer, such as include an insulating material, and may include glass or an organic material, but the present disclosure is not limited thereto.

Figure 9:
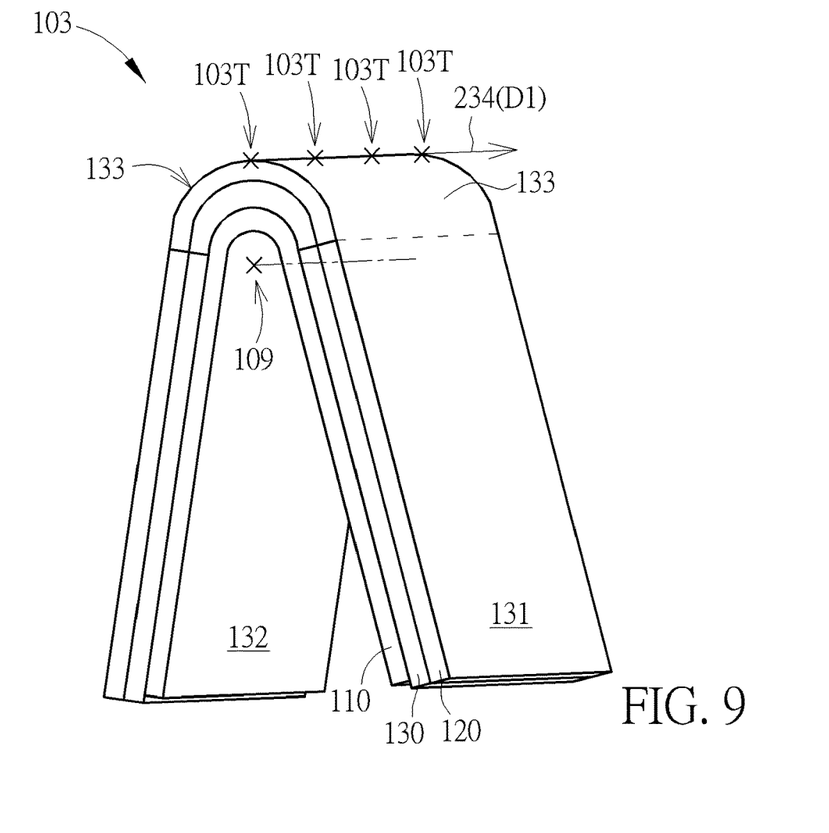
FIG. 9 is a perspective view of the fourth embodiment of a bent electronic device of the present disclosure.

Please refer to FIG. 9. FIG. 9 is a perspective view of the fourth embodiment of a bent electronic device 103 of the present disclosure. The electronic device 103 of the present disclosure may include a pattern layer 110, a display layer 130, and a flexible substrate 120. As described above, the pattern layer 110 may include the plurality of conductive patterns 111, and the details will not be elaborated again. The flexible substrate 120 may be divided into a first flat region 131, a bending region 133, and a second flat region 132. The bending region 133 may be disposed between the first flat region 131 and the second flat region 132. According to some embodiments, the first flat region 131 and the second flat region 132 may not be necessarily completely flat, but compared to the bending region 133, the first flat region 131 and the second flat region 132 may be flatter. The pattern layer 110 may be disposed on the flexible substrate 120 and in the first flat region 131, in the bending region 133, and in the second flat region 132. The electronic device 103 may be bent by using the bending axis 109 as an axis, and the bending axis 109 may be disposed outside of the electronic device 103 of the present disclosure. In the state of being bent, as shown in FIG. 9, any two outmost points 103T in the bending region 133 of the electronic device 103 may be determined, and a line 234 is formed by connecting the two outmost points 103T. A direction may be defined by the line 234 to serve as the first direction D1. The first direction D1 is parallel to the bending axis 109.

Figure 10:
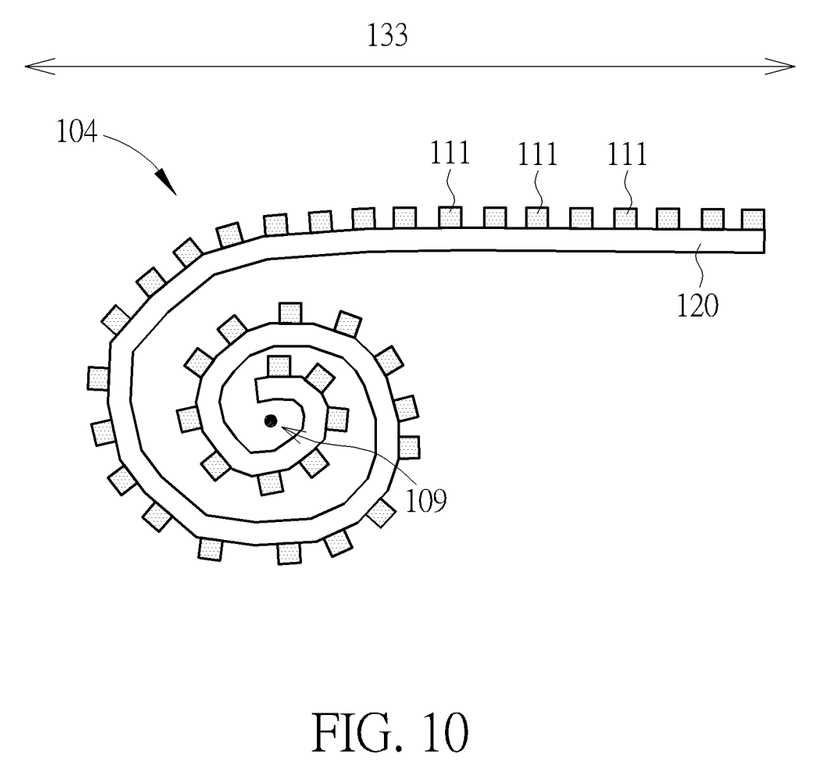
FIG. 10 is a cross-sectional view of the fifth embodiment of an electronic device when in a bent state of the present disclosure.

Please refer to FIG. 10. FIG. 10 is a cross-sectional view of the fifth embodiment of an electronic device 104 when in a bent state of the present disclosure. For the purpose of simplicity, only the flexible substrate 120 and a plurality of conductive patterns 111 are shown in the figure. Specifically speaking, the electronic device 104 of the present disclosure may be rolled. The entire electronic device 104 may be rolled, so the entire disclosed electronic device 104 may be the bending region (or a roll region) 133. As shown in FIG. 10, the electronic device 104 of the present disclosure may be rolled along the bending axis 109 parallel to the first direction D1 as shown in FIG. 2 or in FIG. 3. The bending axis 109 is located outside of the electronic device 104 of the present disclosure, so that the bending region 133 of the entire electronic device 104 may be rolled around the bending axis 109. When being rolled, the bending region 133 may be rolled, so that the entire electronic device 104 may be subjected to a bending stress. The plurality of conductive patterns 111 may extend along the second direction D2 as shown in FIG. 2 or in FIG. 3. According to some embodiments, the bending angle $\theta$ between the first direction D1 and the second direction D2 may be designed to be not greater than 30 degrees, for example, not greater than 22.5 degrees. Accordingly, the plurality of conductive patterns in the bending region 133 may be subjected to a relatively small bending stress.

Figure 11:
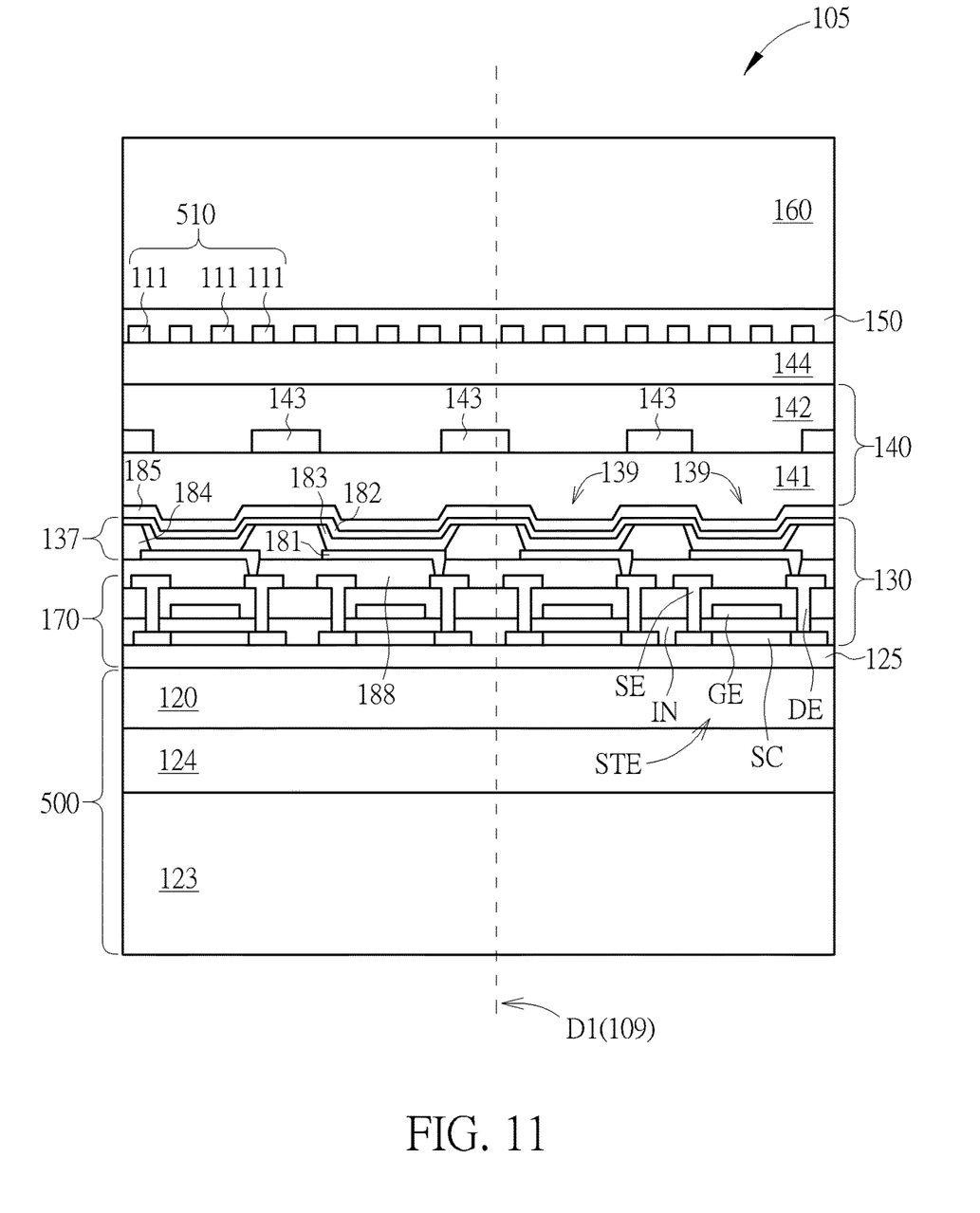
FIG. 11 is a partial cross-sectional view of the sixth embodiment of the electronic device of the present disclosure.

Please refer to FIG. 11. FIG. 11 is a partial cross-sectional view of the sixth embodiment of the electronic device 105 of the present disclosure. For example, the electronic device 105 of the present disclosure may include a flexible substrate 120, a display layer 130, and a plurality of conductive patterns 111. The display layer 130 may include a circuit layer 170 and a light-emitting layer 137. The light-emitting layer 137 may include a plurality of light-emitting units 139. The plurality of conductive patterns 111 may be disposed on the flexible substrate 120 and may form a polarizer 510. The plurality of conductive patterns 111 may overlap at least a portion of the plurality of light-emitting units 139. The electronic device 105 may be bent with respect to the bending axis 109 to serve as the axis. Accordingly, the electronic device 105 may be bent along the first direction D1, and the first direction D1 is parallel to the bending axis 109. The plurality of conductive patterns 111 may extend along the second direction D2 as shown in FIG. 2 or in FIG. 3. The plurality of conductive patterns 111 may serve as a polarizer 510. For example, the plurality of conductive patterns 111 may include a plurality of wire grid polarizing elements to serve as a wire grid polarizer.

According to some embodiments, the flexible substrate 120 may be attached to a surface of a supporting film 123 through a supporting glue 124, so that the flexible substrate 120, the supporting glue 124 and the supporting film 123 may form a substrate structure 500. A buffer layer 125 may be disposed between the flexible substrate 120 and the display layer 130. The buffer layer 125 may include, for example, an oxide layer, a nitride layer or other suitable insulating layers, but the present disclosure is not limited thereto. The circuit layer 170 may be disposed on the buffer layer 125. The circuit layer 170 may include electronic components. The electronic components, for example, may include a wire, a driving component, a switching component, a reset component, a compensation component, an operation control component, a capacitor, or a combination of the above. For example, the circuit layer 170 may include a plurality of driving elements STE arranged in an array. The driving elements STE in FIG. 11 may be represented by thin film transistors, but the present disclosure is not limited thereto. One driving element STE may be electrically connected to the light-emitting unit 139 via the drain electrode DE to drive the light-emitting unit 139.

Specifically speaking, the drain electrode DE may be directly connected to a first electrode 181 of the light-emitting unit 139. In addition, a dielectric layer 188 may be disposed between the first electrode 181 of the light-emitting unit 139 and the conductive layers which form the source electrode SE and the drain electrode DE. In addition, according to some embodiments, the structure of the driving element STE in FIG. 11 may be similar to the structure of the driving element STE shown in FIG. 8, so the details will not be elaborated again. In this embodiment, the driving element STE may be a top-gate type thin film transistor, but the present disclosure is not limited thereto. According to some embodiments, a bottom gate type thin film transistor or other suitable electronic components may be used, and in a flexible display device, the thin film transistor structure may not be limited to only one type.

According to some embodiments, the light-emitting unit 139 may include the first electrode 181, a portion of a second electrode 182, and a display medium layer 183 disposed between the first electrode 181 and the second electrode 182. For example, the first electrode 181 may be an anode of the light-emitting unit 139, and the second electrode 182 may be an cathode of the light-emitting unit 139, but the present disclosure is not limited thereto. The light-emitting region of each light-emitting unit 139 may be defined by an insulating layer 184 which serves as a pixel defining layer (PDL). The display medium layer 183 may include an emissive material with one layer or more layers, and the emissive material may be an organic material or an inorganic material. For example, the display medium layer 183 may include an organic light-emitting layer. In some embodiments, different light-emitting units 139 may be made of different materials to emit light of different colors, such as red light, green light, and blue light. In some embodiments, the display medium layers 183 of different light-emitting units 139 may be made of the same material to emit light of the same color. The first electrode 181 and the second electrode 182 may include a metal or a transparent conductive material, but the present disclosure is not limited thereto. The metal material of the electrode may include, for example, magnesium, calcium, aluminum, silver, tungsten, copper, nickel, chromium, a combination of the above, or an alloy of the materials, but the present disclosure is not limited thereto. The transparent conductive material may, for example, include indium tin oxide, indium zinc oxide, zinc oxide or indium oxide, or a combination of the above, but the present disclosure is not limited thereto. In addition, the surface of the light-emitting unit 139 may be covered with an insulating layer 185 as a protection layer. In some embodiments, the display medium layer 183 may be, for example, a liquid crystal material. In other embodiments, the flexible display device may further include a color filter layer (not shown) and a black matrix (not shown) which may be disposed on the light-emitting unit 139, but the present disclosure is not limited thereto.

The encapsulation layer 140 may be disposed on the display layer 130. According to some embodiment, the encapsulation layer 140 may include a first encapsulation layer 141 and a second encapsulation layer 142 disposed on the first encapsulation layer 141, but the present disclosure is not limited thereto. The first encapsulation layer 141 and the second encapsulation layer 142 may provide the display layer 130 with protection, encapsulation, and/or planarization functions, and may include an organic material, an inorganic material, a combination thereof, or a mixture thereof, but the present disclosure is not limited thereto. For example, the first encapsulation layer 141 and the second encapsulation layer 142 may have a multilayer structure, including an inorganic layer, an organic layer, and an inorganic layer. In some embodiments, the first encapsulation layer 141 and the second encapsulation layer 142 may be replaced by another flexible substrate (not shown), and a color filter layer or a black matrix may be disposed on the another flexible substrate as mentioned above, but the present disclosure is not limited thereto. According to some embodiments, the electronic device 105 may include a phase retardation layer 144, a function layer 150, and a cover layer 160. The phase retardation layer 144 may be disposed on the first encapsulation layer 141, the function layer 150 may be disposed on the phase retardation layer 144, and the cover layer 160 may be disposed on the function layer 150. The conductive patterns 111 may be disposed between the function layer 150 and the phase retardation layer 144. According to some embodiments, the polarizer 510 may be the wire grid polarizer as mentioned above, the phase retardation layer 144 and the polarizer 510 may have an anti-reflection function.

On the other hand, according to some embodiments, the electronic device 105 may be a flexible display device. According to some embodiments, the electronic device 105 may also have a touch function, such as may optionally include a touch layer 143, but the present disclosure is not limited thereto. The touch layer 143 may be disposed on the first encapsulation layer 141. The second encapsulation layer 142 may be disposed on the touch layer 143 to protect the touch layer 143. The conductive patterns 111 may be disposed on the display layer 130 and the touch layer 143.

Figure 12:
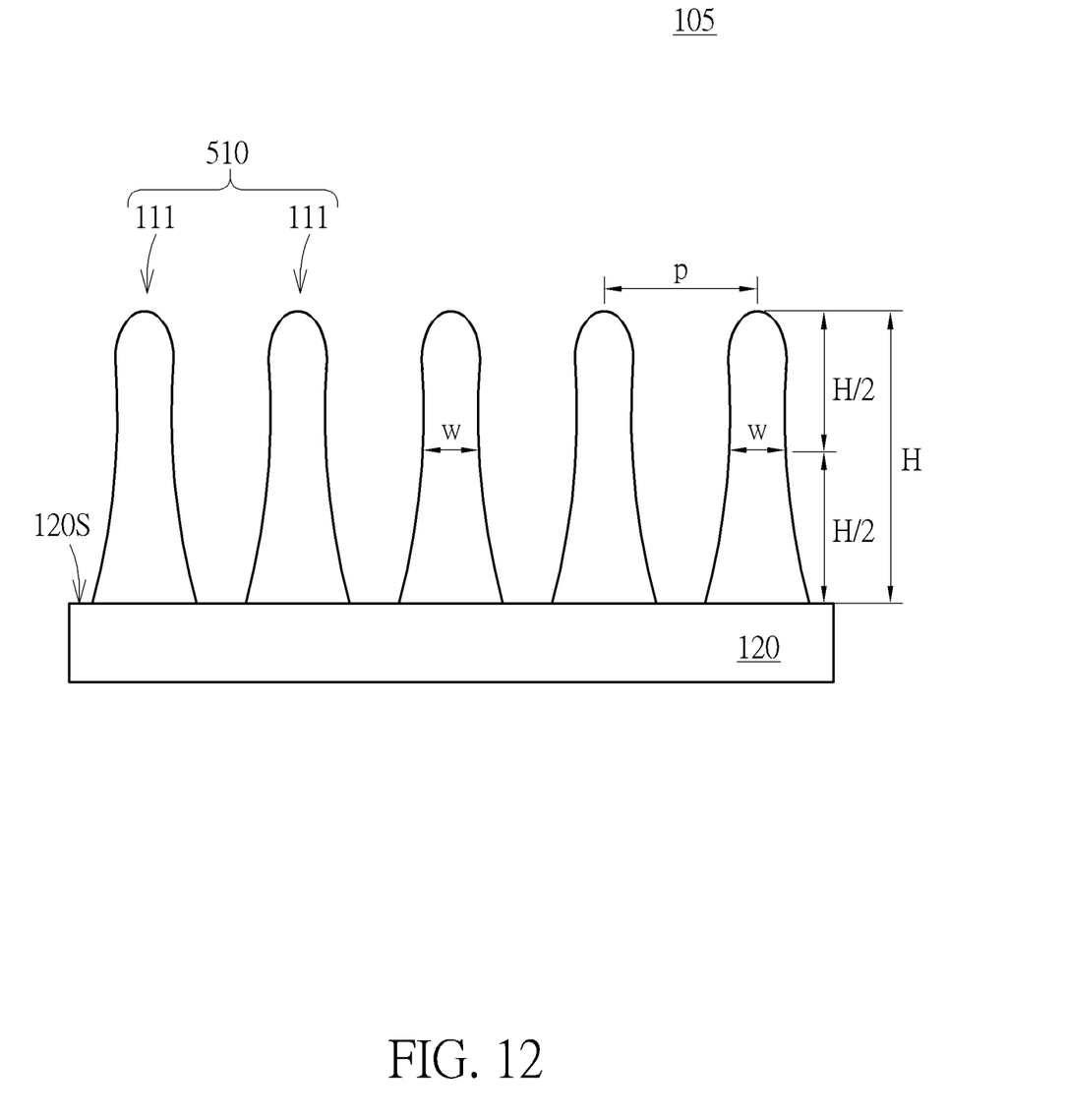
FIG. 12 is an enlarged partial cross-sectional view of the sixth embodiment of the electronic device of the present disclosure.

Please refer to FIG. 12. FIG. 12 is an enlarged partial cross-sectional view of the sixth embodiment of the electronic device 105 of the present disclosure. The plurality of conductive patterns 111 in the electronic device 105 of the present disclosure may include wire grid polarizer elements. As shown in FIG. 12, the plurality of conductive patterns 111 are disposed on the flexible substrate 120 to form a polarizer 510. There may be other film layers disposed between the flexible substrate 120 and the polarizer 510. For simplifying the descriptions, these film layers are not shown in FIG. 12. The wire grid polarizer elements may have a tower-like shape, that is, the plurality of conductive patterns 111 may have a larger width on the surface 120S close to the flexible substrate 120 and a smaller width far from the surface 120S. The width of each conductive pattern 111 at a position H/2 which is half of its height H is defined as a half-height width w. Between adjacent two of the conductive patterns 111 there may be an appropriate pitch p. According to some embodiments, the conductive patterns 111 may be appropriately designed to have a half-height width/pitch ratio (w/p) between 0.2 and 0.5. An appropriate half-height width/pitch ratio (w/p) may make the plurality of conductive patterns 111 have a good polarization effect, and may also reduce the influence of the plurality of conductive patterns 111 on one another when the electronic device 105 of the present disclosure is bent or rolled. For example, the pitch p of the conductive patterns 111 in FIG. 12 may be between 200 nm and 300 nm, and the half-height width w may be 80 nm, but the present disclosure is not limited thereto. The tip of the conductive patterns 111 may also include a rounded tip. According to some embodiments, the tip of the conductive patterns 111 may have an arc-shaped edge.

Figure 13:
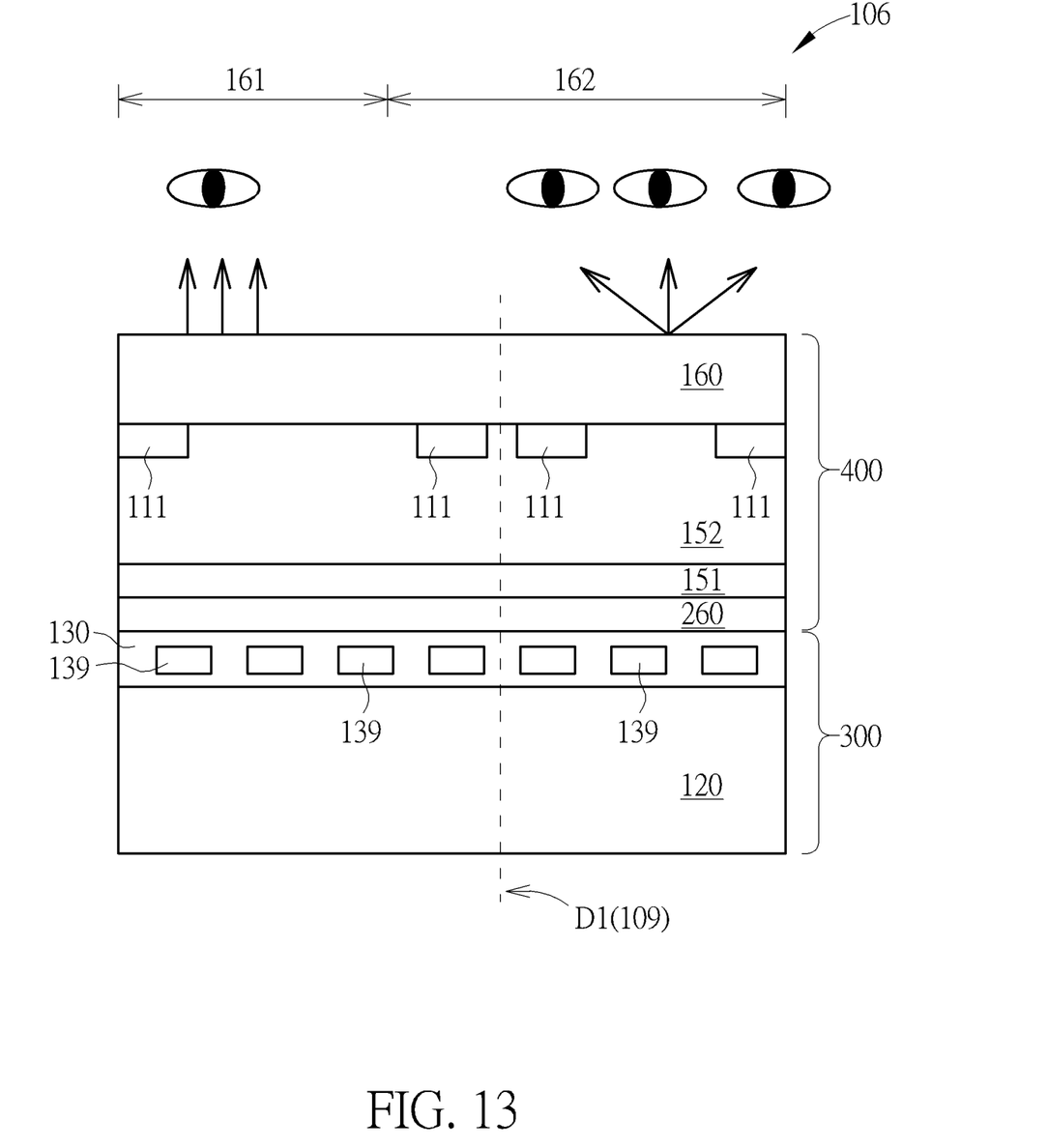
FIG. 13 is a partial cross-sectional view of the seventh embodiment of the electronic device of the present disclosure.

Please refer to FIG. 13. FIG. 13 is a partial cross-sectional view of the seventh embodiment of the electronic device 106 of the present disclosure. The electronic device 106 of the present disclosure shown in FIG. 13 may include a display layer 130 and a plurality of conductive patterns 111. The display layer 130 may include a plurality of light-emitting units 139. The electronic device 106 may be bent along the first direction D1. The plurality of conductive patterns 111 may overlap at least a portion of the plurality of light-emitting units 139 and extend along a second direction D2. The second direction D2 is not shown in FIG. 13, please refer to FIG. 2 and to FIG. 3 instead. Specifically speaking, a plurality of light-emitting units 139 may be disposed on a flexible substrate 120 to form a display panel 300. An electronically switchable layer 400 may be disposed on the display panel 300. The electronically switchable layer 400 may include a switchable privacy layer, for example. The electronically switchable layer 400 may include a plurality of conductive patterns 111 disposed on a substrate 160; a common electrode 151 disposed on a substrate 260; and an electronically switchable material 152 disposed between the plurality of conductive patterns 111 and the common electrode 151. The electronically switchable material 152 may be liquid crystal, for example. The plurality of conductive patterns 111 may serve as electrodes. By adjusting the voltage of the conductive patterns 111 and the common electrode 151, the optical states of the electronically switchable material 152 may be changed, so that the electronic device 106 may be in a share mode or in a privacy mode. By adjusting the voltage, the optical states of the electronically switchable layer 400 may be switched.

According to some embodiments, by adjusting the voltages of the lower electrodes in different regions, different regions in the electronic device 106 may be independently in the share mode or in the privacy mode. For example, please refer to FIG. 13, the electronic device 106 may include a first region 161 and a second region 162. The voltages of the plurality of conductive patterns 111 in the first region 161 and in the second region 162 may be respectively controlled to independently change the optical states of the electronically switchable material 152. For example, the first region 161 and the second region 162 may be independently in one of the privacy mode of narrow viewing angle or the share mode of wide viewing angle. Accordingly, the plurality of conductive patterns 111 may serve as privacy electrodes. The electronic device 106 of the present disclosure may be used as a dashboard or a windshield of a car. According to some embodiments, as shown in FIG. 13, different voltages may be applied to the privacy electrodes 111 in the first region 161 and the second region 162, so that, for example, the first region 161 of the driver seat is in a privacy mode with a narrow viewing angle while the second region 162 of the passenger seat is in the share mode of wide viewing angle. According to some embodiments, a same voltage is applied to the conductive patterns 111 of the first region 161 and of the second region 162, so that both the first region 161 and the second region 162 are in the privacy mode to restrict the users to the images in either the first region 161 or in the second region 162. Alternatively, according to some embodiments, both the first region 161 and the second region 162 may be in the share mode of wide viewing angle. According to some embodiments, the boundary of the first region 161 and the second region 162 may not align with the first direction D1 (as shown in FIG. 13), or according to some embodiments, the boundary of the first region 161 and the second region 162 may align with the first direction D1, but the present invention is not limited thereto. According to some embodiments, the plurality of conductive patterns 111 may overlap at least a portion of the plurality of light-emitting units 139. For example, as shown in FIG. 13, at least one of the conductive patterns 111 may partially overlap at least one of the light-emitting units 139. According to some embodiments, one of the conductive patterns 111 may overlap two or more light-emitting units 139, and the overlap may be a complete overlap or a partial overlap.

According to some embodiments, as shown in FIG. 8 and in FIG. 11, at least one of the conductive patterns 111 may completely overlap one of the light-emitting units 139. According to some embodiments, two or more conductive patterns 111 may completely overlap one of the light-emitting units 139. The number of conductive patterns 111 and the number of light-emitting units 139 may be different. For example, a density of the number of conductive patterns 111 and a density of the number of light-emitting units 139 may be different. For example, according to some embodiments, as shown in FIG. 13, the density of the number of conductive patterns 111 may be less than the density of the number of light-emitting units 139. According to some embodiments, as shown in FIG. 8 and in FIG. 11, the density of the number of conductive patterns 111 may be greater than the density of the number of light-emitting units 139. The density may refer to the number of components per unit length or the number of components per unit area.

As shown in FIG. 13, the plurality of conductive patterns 111 to serve as the privacy electrodes may extend along the second direction D2, the electronic device 106 may be bent along the first direction D1, and the conductive patterns 111 may at least partially overlap at least a portion of the plurality of light-emitting units 139. According to some embodiments, the angle θ between the second direction D2 of the conductive patterns 111 and the first direction D1 may be designed to be not greater than 30 degrees, and further, designed to be not greater than 22.5 degrees. Accordingly, the electronic device 106 and the conductive patterns 111 may be subjected to a relatively small bending stress when the electronic device 106 is bent. Accordingly, the conductive patterns 111 may be kept from being broken or peeled off and from abnormal privacy function due to an excessive stress, and from display malfunctions caused by the excessive stress of the electronic device 106. According to some embodiments, the angle θ between the first direction D1 of the electronic device and the extending direction D2 of the plurality of conductive patterns may be appropriately designed to decrease malfunction caused by the excessive stress when the electronic device is bent.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device capable of being bent in a first direction, comprising:
   a plurality of light-emitting units;
   an encapsulation layer disposed on the plurality of light-emitting units; and
   a plurality of conductive patterns overlapping with at least a portion of the plurality of light-emitting units and overlapping with at least a portion of the encapsulation layer, wherein in a top view, the plurality of conductive patterns extends in a second direction;
   wherein in the top view, the first direction and the second direction have an angle θ of not greater than 30 degrees.

2. The electronic device according to claim 1, wherein the angle θ is not greater than 22.5 degrees.

3. The electronic device according to claim 1, comprising a polarizer, wherein the polarizer comprising the plurality of conductive patterns.

4. The electronic device according to claim 1, wherein the plurality of conductive patterns are made of a material selected from gold, silver, tin, copper, aluminum and a combination thereof.

5. The electronic device according to claim 1, wherein at least a portion of the plurality of conductive patterns comprises a plurality of recessions formed thereon.

6. The electronic device according to claim 1, wherein at least a portion of the plurality of conductive patterns comprises a plurality of openings formed thereon.

7. The electronic device according to claim 1, wherein at least one of the plurality of conductive patterns comprises a first conductive layer and a second conductive layer, the second conductive layer is disposed on the first conductive layer, and a thickness of the first conductive layer is different from a thickness of the second conductive layer.

8. The electronic device according to claim 1, further comprising a flexible substrate, wherein the plurality of conductive patterns are disposed on a surface of the flexible substrate, at least one of the plurality of conductive patterns has a height along a third direction and a width along a fourth direction, wherein the third direction perpendicular to the surface of the flexible substrate, and the fourth direction is a direction parallel to the surface of the flexible substrate, wherein a ratio of the height to the width is greater than or equal to 0.2 and less than or equal to 15.

9. The electronic device according to claim 1, wherein the plurality of conductive patterns are formed by imprinting.

10. The electronic device according to claim 1, further comprising an electronically switchable layer comprising the plurality of conductive patterns.

* * * * *